United States Patent
Itonaga

(10) Patent No.: US 9,343,496 B2
(45) Date of Patent: May 17, 2016

(54) SOLID-STATE IMAGING DEVICE, PRODUCTION METHOD THEREOF AND CAMERA

(75) Inventor: Kazuichiro Itonaga, Tokyo (JP)

(73) Assignee: Sony Corporation, Tokyo (JP)

( * ) Notice: Subject to any disclaimer, the term of this patent is extended or adjusted under 35 U.S.C. 154(b) by 359 days.

(21) Appl. No.: 11/519,663

(22) Filed: Sep. 11, 2006

(65) Prior Publication Data

US 2007/0063234 A1   Mar. 22, 2007

(30) Foreign Application Priority Data

Sep. 22, 2005  (JP) ................ P2005-276873

(51) Int. Cl.
*H01L 27/146* (2006.01)

(52) U.S. Cl.
CPC .... *H01L 27/14632* (2013.01); *H01L 27/14643* (2013.01); *H01L 27/14687* (2013.01); *H01L 27/14689* (2013.01)

(58) Field of Classification Search
CPC ................................. H01L 31/02002
USPC .................... 257/229, 233, 291, 292
See application file for complete search history.

(56) References Cited

U.S. PATENT DOCUMENTS

| | | | | |
|---|---|---|---|---|
| 5,859,462 A * | 1/1999 | Tredwell et al. | ............ | 257/443 |
| 6,114,740 A * | 9/2000 | Takimoto et al. | ............ | 257/461 |
| 6,258,636 B1 * | 7/2001 | Johnson et al. | ............ | 438/149 |
| 6,433,374 B1 * | 8/2002 | Fukunaga et al. | ........... | 257/292 |
| 6,593,607 B1 * | 7/2003 | Hseih | ............ | 257/292 |
| 7,588,956 B2 * | 9/2009 | Lim | ........ | H01L 27/14603 257/290 |
| 8,492,865 B2 * | 7/2013 | Venezia | ............ | H01L 27/1464 257/291 |
| 2001/0054677 A1 * | 12/2001 | Nakashima | ............... | 250/208.1 |
| 2004/0046193 A1 * | 3/2004 | Park et al. | ............ | 257/292 |
| 2004/0119864 A1 * | 6/2004 | Kikuchi | ............ | 348/308 |
| 2005/0056905 A1 * | 3/2005 | Kuwabara | .......... | H01L 27/1463 257/446 |
| 2005/0133825 A1 * | 6/2005 | Rhodes et al. | ............ | 257/204 |
| 2005/0263804 A1 * | 12/2005 | Yoshihara | ............ | 257/291 |

FOREIGN PATENT DOCUMENTS

| | | |
|---|---|---|
| JP | 59-072164 | 4/1984 |
| JP | 63-182854 | 7/1988 |
| JP | 06-069483 | 3/1994 |
| JP | 07-045806 | 2/1995 |
| JP | 2000-138868 | 5/2000 |
| JP | 2004-072077 | 3/2004 |
| JP | 2004-200192 | 7/2004 |
| WO | WO 03/075353 | 9/2003 |

* cited by examiner

*Primary Examiner* — Benjamin Sandvik
(74) *Attorney, Agent, or Firm* — Robert J. Depke; The Chicago Technology Law Group, LLC

(57) ABSTRACT

A solid-state imaging device and the production method capable of effectively suppressing color mixture between sensor portions, and a camera provided with the solid-state imaging device are provided: wherein the solid-state imaging device includes a first conductivity type semiconductor substrate, a second conductivity type epitaxial layer formed on the first conductivity type semiconductor substrate, a first conductivity type sensor portion formed in the epitaxial layer, and an active element formed in the epitaxial layer and for reading charges obtained by photoelectric conversion at the sensor portion.

9 Claims, 7 Drawing Sheets

SOLID-STATE IMAGING DEVICE, PRODUCTION METHOD THEREOF AND CAMERA

CROSS REFERENCES TO RELATED APPLICATIONS

The present invention contains subject matter related to Japanese Patent Application JP 2005-276873 filed in the Japanese Patent Office on Sep. 22, 2005 the entire contents of which being incorporated herein by reference.

BACKGROUND OF THE INVENTION

1. Field of the Invention

The present invention particularly relates to a MOS-type solid-state imaging device, a production method thereof, and a camera provided with the solid-state imaging device.

2. Description of the Related Art

In a solid-state imaging device, such as a CCD and a CMOS, a substrate structure is generally used, wherein an n-type epitaxial layer is stacked on an n-type semiconductor substrate (refer to the Japanese Unexamined Patent Publication No. 6-69483). The substrate structure of stacking an n-type epitaxial layer on an n-type semiconductor substrate is often used in a CCD sensor because a semiconductor substrate is predicated on being an n-type when realizing a vertical overflow drain. In a CMOS sensor, a substrate structure of stacking an n-type epitaxial layer on an n-type semiconductor substrate is used for suppressing blooming at the time of taking a picture of a highly bright object.

When using the above substrate structure, sensor portions are formed by introducing an n-type impurity in the n-type epitaxial layer. The sensor potions are formed to have the largest possible area on a unit pixel. Between the sensor portions, that is, between the respective unit pixels, p-type channel stoppers (pixel isolation p-wells) are formed. Alignment of the sensor portions and the pixel isolation p-wells prevents flowing in and out of signal electrons between adjacent sensor portions, which is significant to prevent mixture of colors.

SUMMARY OF THE INVENTION

However, as pixels become finer, it has become more difficult to prevent mixture of colors. This is because regions between the pixels become very narrow and a width of pixel isolation p-wells to be formed between the pixels also becomes narrow. To prevent mixture of colors, the pixel isolation p-wells have to be formed deep. The number of ion implantation increases much to form deep pixel isolation p-wells, so that there are disadvantages that the production steps increase and the cost becomes high.

Furthermore, to realize deep ion implantation, a sufficiently thick resist mask or a hard mask becomes necessary. Since a mask used for forming the pixel isolation p-wells is formed in a pattern of covering the sensor portions, it becomes a vertically long column-shaped mask pattern being isolated from one another. A vertically long column-shaped mask pattern is likely to fall down, which leads to a decline of the yield.

As explained above, formation of highly concentrated deep pixel isolation p-wells in an n-type epitaxial layer by ion implantation has approached the limit.

It is desired to provide a solid-state imaging device and a camera capable of effectively suppressing color mixture between sensor portions.

It is also desired to provide a production method of a solid-state imaging device capable of forming a diffusion isolation layer for easily isolating the sensor portions.

According to an embodiment of the present invention, there is provided a solid-state imaging device having a first conductivity type semiconductor substrate; a second conductivity type epitaxial layer formed on the semiconductor substrate; a first conductivity type sensor portion formed in the epitaxial layer; and an active element formed in the epitaxial layer and for reading charges obtained by photoelectric conversion at the sensor portion.

According to an embodiment of the present invention, there is provided a production method of a solid-state imaging device, including the steps of forming a second conductivity type epitaxial layer on a first conductivity type semiconductor substrate; forming a first conductivity type sensor portion in the epitaxial layer; and forming an active element in the epitaxial layer.

According to an embodiment of the present invention, there is provided a camera having a solid-state imaging device; an optical system for introducing an incident light to an imaging portion of the solid-state imaging device; and a signal processing circuit for performing processing on output signals of the solid-state imaging device: wherein the solid-state imaging device has a first conductivity type semiconductor substrate, a second conductivity type epitaxial layer formed on the semiconductor substrate, a first conductivity type sensor portion formed in the epitaxial layer, and an active element formed in the epitaxial layer and for reading charges obtained by photoelectric conversion at the sensor portion.

According to an embodiment of the present invention, a solid-state imaging device and a camera, wherein color mixture between sensor portions is suppressed, can be realized. According to the production method of the solid-state imaging device of an embodiment of the present invention, it is possible to form a diffusion isolation layer for easily isolating the sensor portions.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENT

Below, an embodiment of the present invention will be explained with reference to the drawings.

Figure 1:
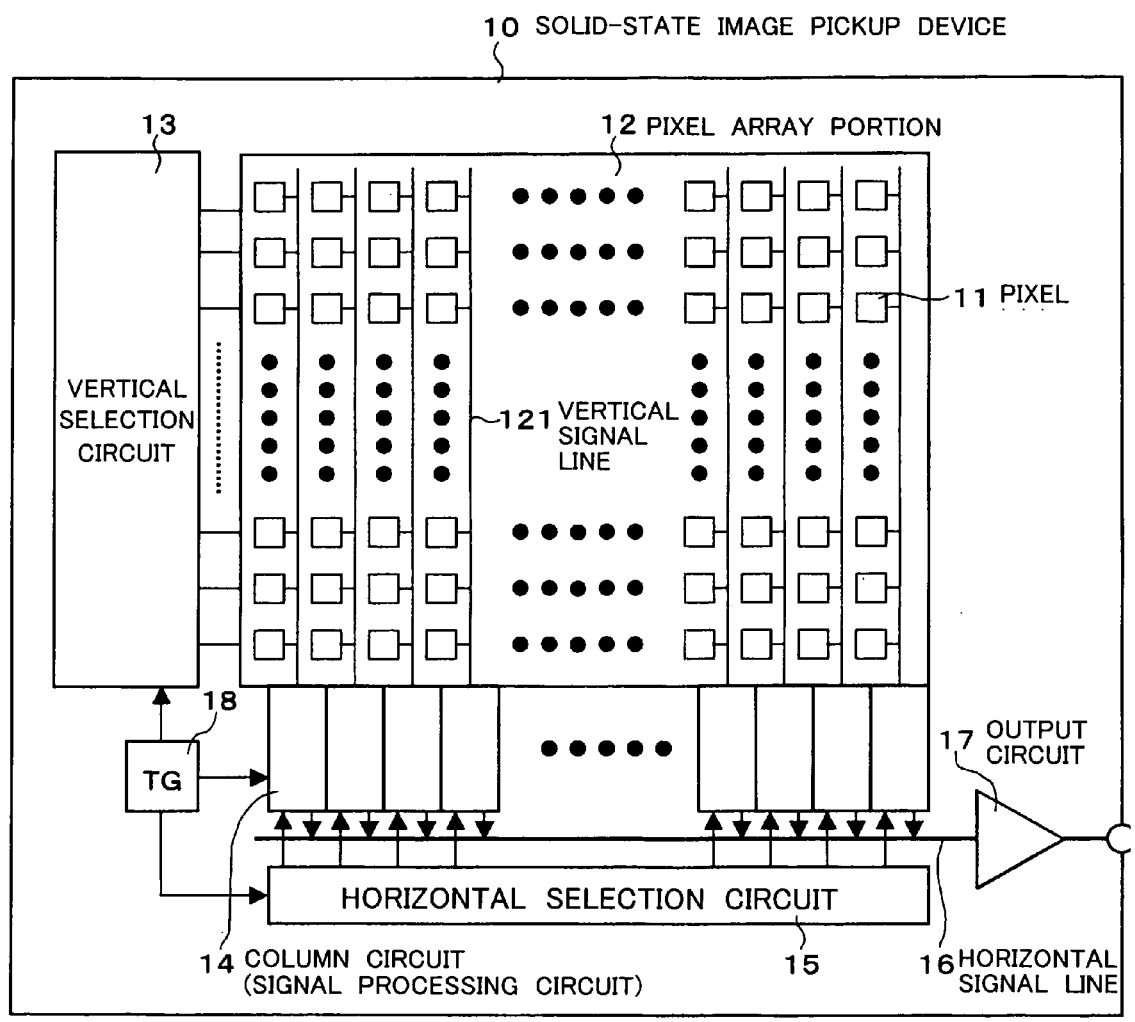
FIG. 1 is a block diagram of an example of the configuration of a solid-state imaging device according to an embodiment of the present invention.

FIG. 1 is a block diagram of an example of the configuration of a solid-state imaging device according to the present embodiment. In the present embodiment, a MOS type image sensor will be explained as an example.

A solid-state imaging device 10 includes unit pixels 11 each including, for example, a photodiode as a photoelectric conversion element, a pixel array portion (imaging portion) 12 formed by the pixels 11 arranged two-dimensionally in matrix, a vertical selection circuit 13, a column circuit 14 as a signal processing circuit, a horizontal selection circuit 15, a horizontal signal line 16, an output circuit 17 and a timing generator (TG) 18.

On the pixel array portion 12, vertical signal lines 121 are provided by one for each line of the pixel arrangement in matrix. The specific circuit configuration of the unit pixels 11 will be explained later on.

The vertical selection circuit 13 is composed of a shift register, etc. The vertical selection circuit 13 successively outputs a transfer signal for driving a transfer transistor of each pixel 11, a reset signal for driving a reset transistor and other control signal in units of lines so as to selectively drive each pixel 11 on the pixel array portion 12 in units of lines.

The column circuit 14 is a signal processing circuit arranged for each pixels in the line direction of the pixel array portion 12, that is, for each of the vertical signal lines 121. The column circuit 14 is composed, for example, of a sample/hold (S/H) circuit and a correlated double sampling (CDS) circuit, etc.

The horizontal selection circuit 15 is composed of a shift register, etc. and successively selects a signal of each pixel 11 output through the column circuit 14 and makes the signal output to the horizontal signal line 16. Note that, in FIG. 1, illustration of a horizontal selection switch is omitted for simplification of the drawing. The horizontal selection circuit 15 drives the horizontal selection switch to be turned on/off successively in units of lines.

As a result of selection driving by the horizontal selection circuit 15, signals of unit pixels 11 output successively for each line from the column circuit 14 are supplied to the output circuit 17 through the horizontal signal line 16, subjected to signal processing, such as amplification, in the output circuit and, then, output to outside of the device.

The timing generator 18 generates a variety of timing signals and performs driving and controlling of the vertical selection circuit 13, the column circuit 14 and the horizontal selection circuit 15, etc. based on the timing signals.

Figure 2:
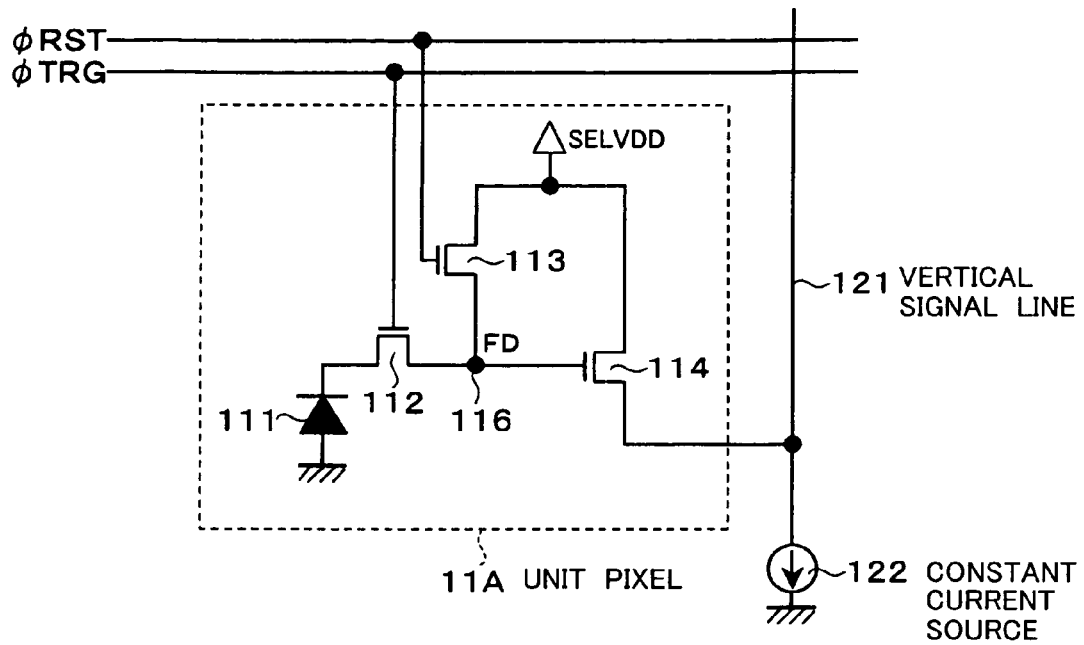
FIG. 2 is a circuit diagram of an example of the circuit configuration of a unit pixel.

FIG. 2 is a circuit diagram of an example of the circuit configuration of a unit pixel.

The unit pixel 11A includes, in addition to a photoelectric conversion element, such as a photodiode 111, for example, three transistors (active elements): a transfer transistor 112, a reset transistor 113 and an amplification transistor 114. Here, for example, n-channel MOS transistors are used as the transistors 112 to 114.

The transfer transistor 112 is connected between a cathode of the photodiode 111 and a floating diffusion (FD) portion 116. As a result of giving a transfer pulse φTRG to a gate of the transistor 112, photoelectric conversion is performed in the photodiode 111, and signal charges (electrons in this case) accumulated therein are transferred to the FD portion 116.

A drain of the reset transistor 113 is connected to a selection power source SELVDD and a source thereof is connected to the FD portion 116. Prior to a transfer of signal charges from the photodiode 111 to the FD portion 116, a potential of the FD portion is reset by being given a reset pulse φRST to the gate. The selection power source SELVDD is a power source, which selectively becomes a VDD level and a GND level as a power source voltage.

The amplification transistor 114 configures a source follower circuit, wherein a gate is connected to the FD portion 116, a drain is connected to the selection power source SELVDD and a source is connected to the vertical signal line 121. The amplification transistor 114 outputs as a reset level a potential of the FD portion 116 after being reset by the reset transistor 113 to the vertical signal line 121 and outputs as a signal level a potential of the FD portion 116 after transferring signal charges by the transfer transistor 112 to the vertical signal line 121.

Figure 3:
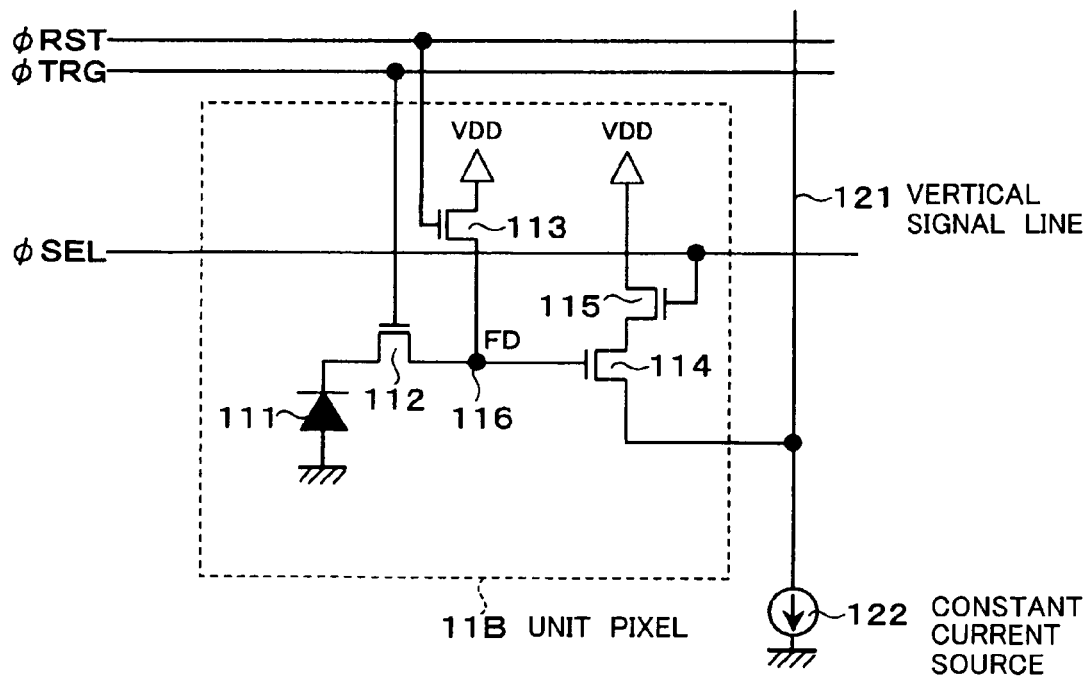
FIG. 3 is a circuit diagram of another example of the circuit configuration of a unit pixel.

FIG. 3 is a circuit diagram of another example of the circuit configuration of a unit pixel.

The unit pixel 11B is a pixel circuit including, in addition to a photoelectric conversion element, such as a photodiode 111, for example, four transistors: a transfer transistor 112, a reset transistor 113, an amplification transistor 114 and a selection transistor 115. Here, for example, n-channel MOS transistors are used as the transistors 112 to 115.

The transfer transistor 112 is connected between a cathode of the photodiode 111 and a floating diffusion (FD) portion 116. As a result of giving a transfer pulse φTRG to a gate of the transistor 112, photoelectric conversion is performed in the photodiode 111, and signal charges (electrons here) accumulated therein are transferred to the FD portion 116.

A drain of the reset transistor 113 is connected to a power source VDD and a source thereof is connected to the FD portion 116. Prior to a transfer of signal charges from the photodiode 111 to the FD portion 116, a potential of the FD portion is reset by being given a reset pulse φRST to the gate of the reset transistor 113.

A drain of the selection transistor 115 is connected, for example, to a power source VDD and a source thereof is connected to a drain of the amplification transistor 114. The selection transistor 115 becomes a turned on state by being given a selection pulse φSEL to the gate, and selection of the pixel 11B is made by supplying a power source VDD to the amplification transistor 114. Note that the selection transistor 115 may be configured to be connected between a source of the amplification transistor 114 and the vertical signal line 121.

The amplification transistor 114 configures a source follower circuit, wherein a gate is connected to the FD portion 116, a drain is connected to a source of the selection transistor 115 and a source is connected to the vertical signal line 121. The amplification transistor 114 outputs as a reset level a potential of the FD portion 116 after reset by the reset transistor 113 to the vertical signal line 121 and, furthermore, outputs as a signal level a potential of the FD portion 116 after transferring signal charges by the transfer transistor 112 to the vertical signal line 121.

In the unit pixel 11A having the three-transistor configuration and the unit pixel 11B having the four-transistor configuration explained above, an analog operation is performed that signal charges obtained by photoelectric conversion in the photodiode 111 are transferred by the transfer transistor 112 to the FD portion 116, a potential in accordance with the signal charges of the FD portion 116 is amplified by the amplification transistor 114 and output to the vertical signal line 121.

Figure 4:
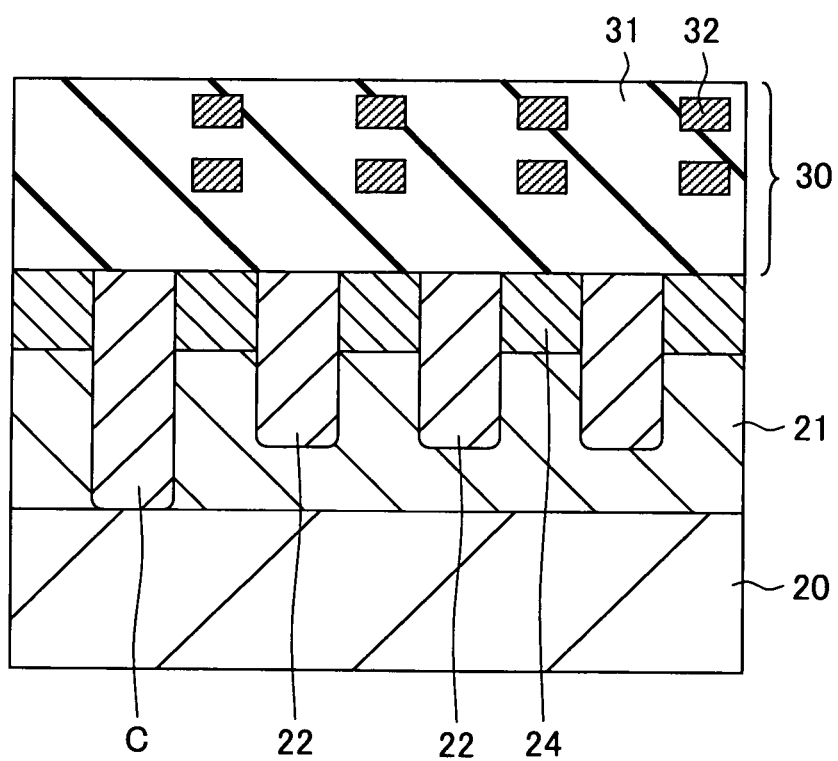
FIG. 4 is a schematic sectional view of a solid-state imaging device according to the present embodiment.

FIG. 4 is a schematic sectional view of a solid-state imaging device according to the present embodiment explained above. In the present embodiment, an example, wherein the first conductivity type is an n-type and the second conductivity type is a p-type, will be explained.

In the present embodiment, a substrate structure of forming a p-type epitaxial layer 21 on an n-type silicon substrate (semiconductor substrate) is applied. A resistivity of the p-type epitaxial layer 21 is 5 to 15 Ω·cm. An n-type sensor portion 22 is formed in the p-type epitaxial layer 21. While not illustrated, on the outermost surface of the n-type sensor portion 22, a p-type region for suppressing dark current is formed. The photodiode 111 in FIG. 2 and FIG. 3 is configured by pn-junction between the n-type sensor portion 22 and p-type epitaxial layer 21.

A contact portion C for applying a voltage to the n-type silicon substrate 20 is formed. The contact portion C is formed by using an n-type sensor portion 22, which will be explained later on. For example, a voltage (for example, +2.7V) is supplied to the n-type silicon substrate 20 via the n-type sensor portion 22.

Between the n-type sensor portions 22 composing the pixel, a p-type diffusion isolation layer 24 is formed. As will be explained later on, the diffusion isolation layer 24 is formed by a self-aligning way with respect to the n-type sensor portions 22. The respective n-type sensor portions 22 are electrically isolated on the surface layer part by the diffusion isolation layer 24 and electrically isolated at the deep part by the p-type epitaxial layer 21. A depth of the n-type sensor portion 22 is, for example, 3 μm.

While not illustrated, on the surface layer part of the diffusion isolation layer 24, the transistors 112, 113, 114 and 115 shown in FIG. 2 and FIG. 3 are formed. Namely, a source/drain region of the transistors is formed on the surface layer portion of the diffusion isolation layer 24, and gate electrodes of the transistors are formed on the diffusion isolation layer 24.

As an upper layer of the p-type epitaxial layer 21, a wiring layer 30 is formed. The wiring layer 30 includes an interlayer insulation film 31 formed, for example, by silicon oxide and wirings 32 formed by being buried in the interlayer insulation film 31. In the present example, an example of three-layer wiring is illustrated. The wirings 32 are aluminum wirings or copper wirings. While not illustrated, the wiring layer 30 is connected to gate electrodes and source/drain region of the transistors. The interlayer insulation film 31 is arranged to get around a region for arranging the n-type sensor portions 22.

While not illustrated, on the wiring layer 30, a planarizing layer formed by a resin, a color filter, a planarizing layer formed by a resin and an on-chip lens are formed. Note that an intra-layer lens may be formed in the wiring layer 30.

Figure 5:
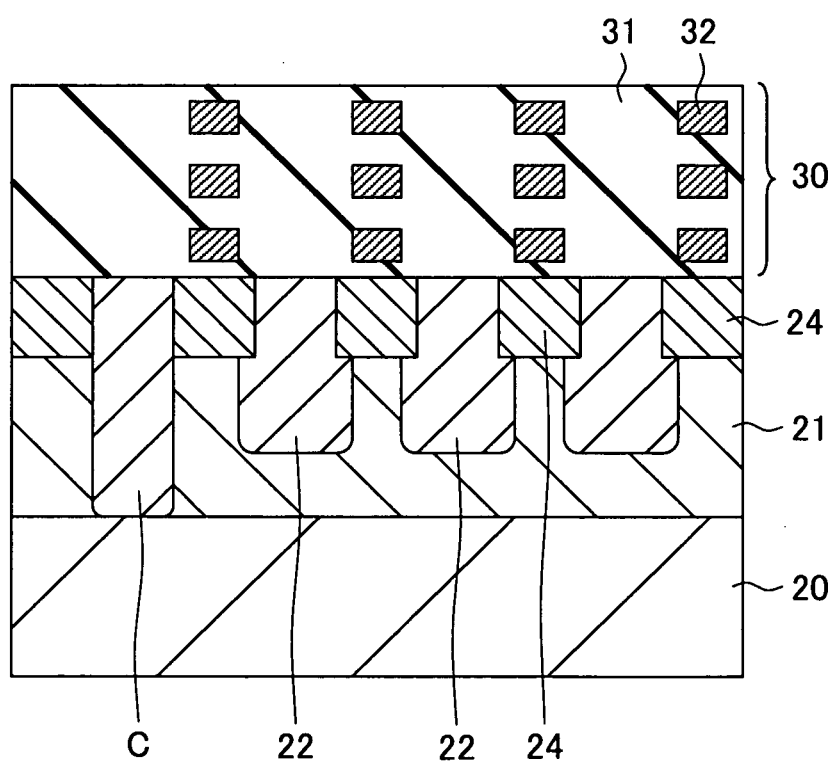
FIG. 5 is a sectional view of another example of a solid-state imaging device according to an embodiment of the present invention.

FIG. 5 is a view of a modified example of an n-type sensor portion 22.

An area (size) of the n-type sensor portion 22 differs between the substrate deep part and the substrate surface part. In this case, an area at the sensor deep part is formed larger than an area at the sensor surface part. Consequently, a larger amount of signal charges subjected to photoelectric conversion can be accumulated at the substrate deep part of the n-type sensor portion 22, and an improvement of the sensitivity can be attained.

Next, a production method of the solid-state imaging device according to the present embodiment explained above will be explained with reference to FIGS. 6A and 6B and FIGS. 7A and 7B.

Figure 6A:
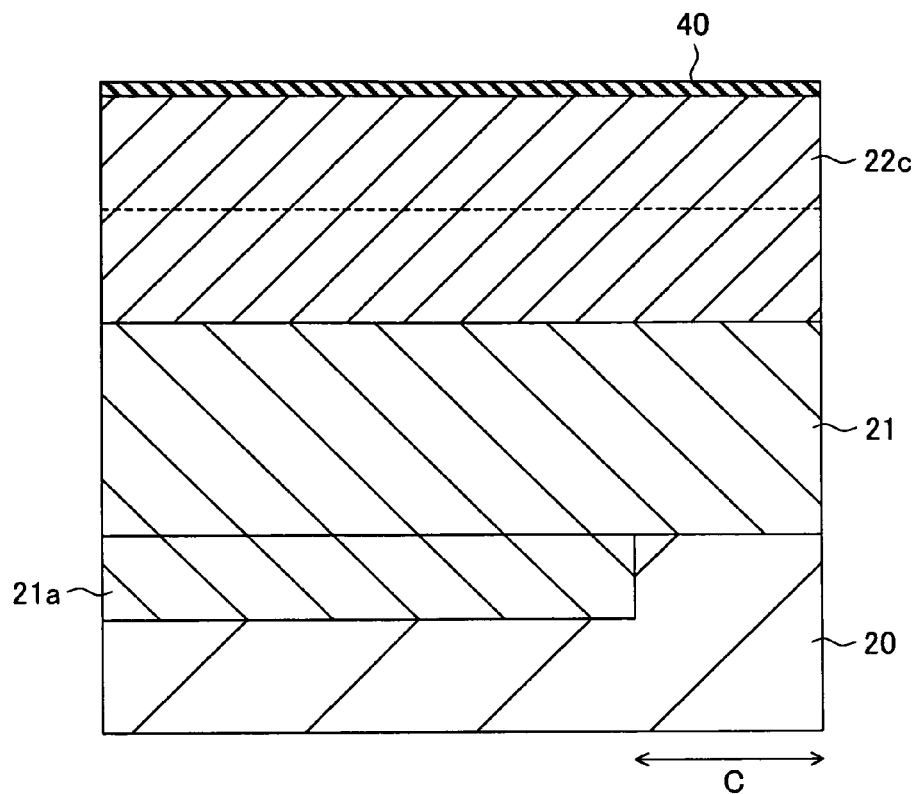
FIGS. 6A and 6B are sectional views of steps in producing a solid-state imaging device according to an embodiment of the present invention.

As shown in FIG. 6A, a p-type epitaxial layer 21 is formed on an n-type silicon substrate 20 by the epitaxial growth method. A thickness of the p-type epitaxial layer 21 is, for example, 3 to 4 μm. Continuously, a through film 40 formed by a silicon oxide is formed on the p-type epitaxial layer 21. Then, p-type wells (second conductivity type regions) 21a are formed by ion implantation at a boundary surface region of the n-type silicon substrate 20 and the p-type epitaxial layer 21 except for contact portions. As a result, a distance from a surface of the p-type epitaxial layer 21 to the n-type silicon substrate 20 becomes short at the contact portions C. Furthermore, an n-type impurity is ion implanted to the p-type epitaxial layer 21 at the pixel array portion to form n-type regions 22 on the substrate surface part. In the drawing, an n-type region formed by one-time ion implantation is indicated by a dotted line. Accordingly, in the present embodiment, the n-type regions 22c are formed by performing ion implantation for two times.

Figure 6B:
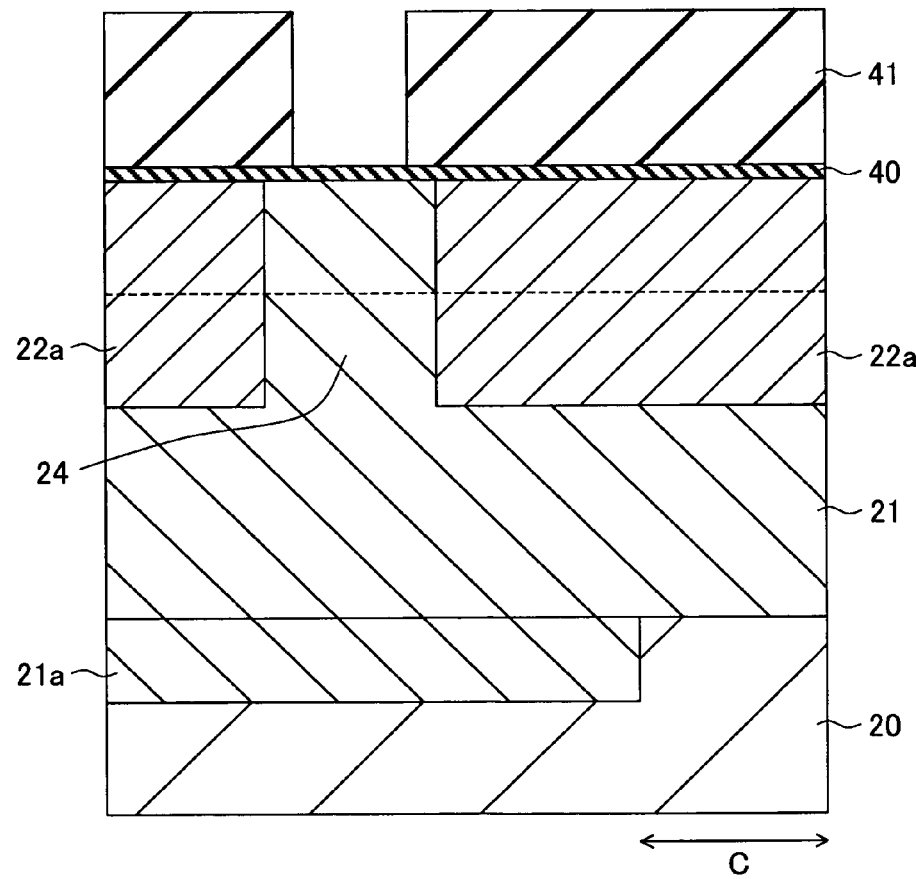

Next, as shown in FIG. 6B, a first mask 41 in a pattern having openings on regions between the n-type sensor portions, that is, on the pixel isolation regions is formed on the through film 40. The first mask 41 is formed by forming a silicon nitride film on the through film 40 and performing etching on the silicon nitride film by using a resist mask. The resist mask on the first mask 41 may be left as it is or removed.

Next, as shown in FIG. 6B, p-type impurity is ion implanted to form a diffusion isolation layer 24. As a result, the diffusion isolation layer 24 having p-type impurity implanted and sensor surface part 22a other than that are formed in a self-aligning way. The diffusion isolation layer 24 is formed to have approximately the same depth as that of the sensor surface part 22a.

Figure 7A:
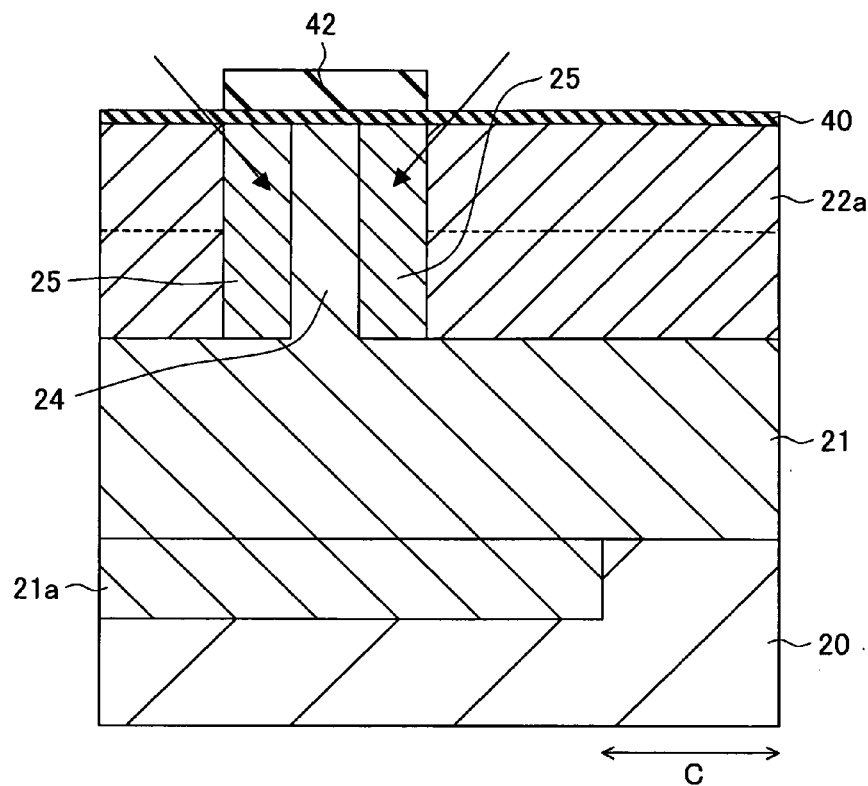
FIGS. 7A and 7B are sectional views of steps in producing a solid-state imaging device according to an embodiment of the present invention.

Next, as shown in FIG. 7A, a second mask 42 in a pattern corresponding to the opening portions of the first mask 41 is formed. For example, a silicon oxide film is stacked allover the first mask including the opening portions by the high density plasma (HDP)-CVD method, unnecessary silicon oxide film stacked on the first mask 41 is removed by the CMP method, then, the first mask 41 is removed. As a result, the second mask 42 formed by the silicon oxide film is formed.

In accordance with need, an electric field relaxation layer 25 is formed by oblique ion implantation using the second mask 42 (for example, an angle at 30 degrees) by performing ion implantation of an n-type impurity in a smaller dose amount than that of the sensor surface part 22a at the boundary portion of the sensor surface part 22a and the diffusion isolation layer 24. The electric field relaxation layer 25 is formed in a self-aligning way with respect to the sensor surface part 22a and the diffusion isolation layer 24. The electric field relaxation layer 25 is capable of preventing formation of a sharp pn-junction between the sensor surface part 22a and the diffusion isolation layer 24, and the electric field is relaxed. The electric field relaxation layer 25 is a thin p-type.

Figure 7B:
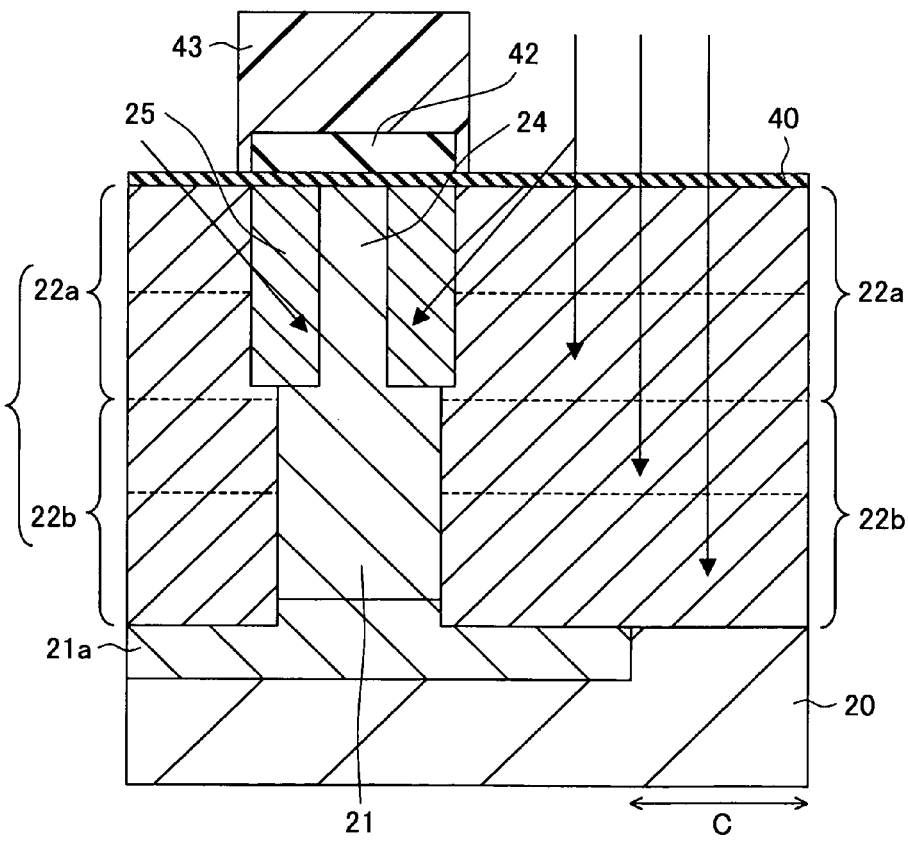

Next, as shown in FIG. 7B, a third mask 43 is formed on the second mask 42 in accordance with need. The third mask 43 is, for example, a resist mask. Continuously, ion implantation of an n-type impurity is performed to the substrate deep part by using the second mask 42 and the third mask 43 so as to form the sensor deep part 22b.

A thick mask may be required for ion implantation for forming the sensor deep part 22b. Therefore, when a thickness of the second mask 42 is not sufficient, a third mask 43 is preferably formed. Note that oblique ion implantation of an n-type impurity may be performed in accordance with need. Ion implantation has to be performed for several times to form the sensor deep part 22b.

On the region formed with the p-well 21a, n-type sensor portion 22 is formed by the sensor surface part 22a and the sensor deep part 22b. On other region than the p-type well 21a, the sensor deep part 22b and the n-type silicon substrate 20 are connected and an n-type contact portion C is formed. In this way, the step of forming the n-type sensor portion 22 is used to form the n-type contact portion C.

After that, the second mask and the third mask are removed. Continuously, high temperature thermal processing is performed. The high temperature thermal processing is performed, for example, at 1000° C. for 120 minutes. As a result, defects of the n-type sensor portions 22 are decreased and a reduction of white points, an improvement of a charge amount to be handled and an increase of sensitivity can be attained.

Continuously, a variety of transistors are formed on the diffusion isolation layer 24. After forming the transistors, ion implantation using gate electrodes of the transistors and a resist as a mask is performed to form a p-type region on the uppermost surface of the n-type sensor portion 22.

After that, a wiring layer 30 is formed on the p-type epitaxial layer 21. Steps after that are to form a planarizing layer, a color filter, a planarizing layer and an on-chip lens on the wiring layer 30, so that a solid-state imaging device is completed.

In the solid-state imaging device according to the present embodiment explained above, a substrate structure having a p-type epitaxial layer 21 on the n-type silicon substrate 20 is used. Consequently, as a result of performing ion implantation of p-type impurity only on the surface part of the p-type epitaxial layer 21, n-type sensor portions 22 of the respective pixels can be electrically isolated. Namely, the sensor surface part 22a of the n-type sensor portion 22 is electrically isolated by the diffusion isolation layer 24, and the sensor deep part 22b is electrically isolated by the p-type epitaxial layer 21.

As a result, the step of deep ion implantation of a p-type impurity for isolating the n-type sensor portions 22 becomes unnecessary, so that the production step can be simplified, the yield can be improved, and a reliable solid-state imaging device can be produced.

Also, in the present embodiment, since the sensor surface part 22a and the diffusion isolation layer 24 are formed in a self-aligning way, alignment deviation does not arise between the n-type sensor portions 22 and the diffusion isolation layer 24 on the surface part. Therefore, color mixture of signal charges can be prevented.

Also, the n-type sensor portions 22 are formed before forming the transistors, high temperature thermal processing can be performed before forming the transistors after forming the n-type sensor portions 22, defects of the n-type sensor portions 22 can be reduced and white points can be reduced. On the other hand, in the related art of forming the n-type sensor portions by using gate electrodes of the transistors as a mask, high temperature thermal processing cannot be performed after forming the n-type sensor portions.

In the present embodiment, sensor deep parts 22b of the respective pixels are electrically isolated by the p-type epitaxial layer 21. Generally, the deeper the depth of ion implantation, the wider the ion implantation region becomes for that amount. Accordingly, an area of the sensor surface part 22a and an area of the sensor deep part 22b are not same and, as shown in FIG. 5, the sensor deep part 22b has a larger area comparing with that of the sensor surface part 22b.

Here, in the case where a position hard to attain electric isolation between sensor deep parts 22b is known in advance, concentration of p-type impurity of the p-type epitaxial layer 21 may be increased at the position. In that case, in the epitaxial growing step of the p-type epitaxial layer 21 shown in FIG. 6A, a p-type epitaxial layer 21 having different impurity concentration is formed in the depth direction.

The solid-state imaging device explained above is used for a camera, such as a video camera, digital still camera, and an electronic endoscope camera.

Figure 8:
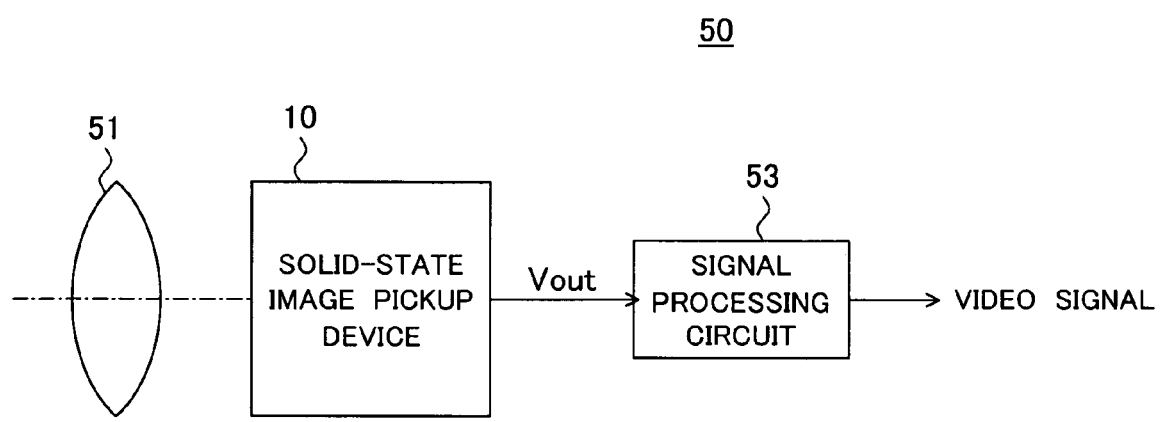
FIG. 8 is a block diagram of the configuration of a camera, wherein the solid-state imaging device according to an embodiment of the present invention is applied.

FIG. 8 is a schematic view of the configuration of a camera, wherein the solid-state imaging device is used therein.

The camera 50 includes the solid-state imaging device 10 explained above, an optical system 51 and a signal processing circuit 53.

The optical system 51 forms an image of an image light (incident light) from an object to be shot on an imaging surface of the solid-state imaging device 10. As a result, the incident light is converted to signal charges in accordance with an incident light amount on the n-type sensor portion 22 of the solid-state imaging device 10, and the signal charges are accumulated in the n-type sensor portions 22 for a certain period.

The signal processing circuit 53 performs various signal processing on output signals of the solid-state imaging device 10 and outputs as video signals.

According to a camera provided with the solid-state imaging device according to the present embodiment explained above, a camera attaining suppression of color mixture and a reduction of white points can be realized.

The present invention is not limited to the explanation of the above embodiment.

For example, the p-type diffusion isolation layer 24 and the sensor surface part 22a may be formed in a self-aligning way by performing ion implantation of n-type impurity on a region of the n-type sensor portions by using a mask after forming the p-type regions on the pixel array portion. Also, timing of forming the p-type wells 21a is not limited as far as it is before formation of the transistors.

Other than the above, it should be understood by those skilled in the art that various modifications, combinations, sub-combinations and alternations may occur depending on design requirements and other factors insofar as they are within the scope of the appended claims or the equivalents thereof.

What is claimed is:

1. A solid-state imaging device, comprising:
   a semiconductor substrate;
   a second conductivity type epitaxial layer formed over the semiconductor substrate;
   a plurality of first conductivity type first sensor portions formed in the epitaxial layer;
   a plurality of first conductivity type second sensor portions formed below the plurality of the first sensor portions in the epitaxial layer;
   a second conductivity type diffusion isolation region formed in the epitaxial layer between the first sensor portions;
   a first conductivity type contact portion in the epitaxial layer connected to a surface of the semiconductor substrate, the first conductivity contact portion applying a predetermined voltage to the semiconductor substrate; and
   wherein the contact portion is formed of the material that forms the second sensor portions which extends to contact the semiconductor substrate.

2. A solid-state imaging device as set forth in claim 1, wherein concentration of a second conductivity type impurity of the epitaxial layer differs in a depth direction.

3. A solid-state imaging device as set forth in claim 1, wherein an area of the sensor portion is larger at a deep region relative to the area at a shallow region.

4. A solid-state imaging device, comprising:
   a semiconductor substrate;

a second conductivity type epitaxial layer formed over the semiconductor substrate;

a plurality of first conductivity type first sensor portions formed in the epitaxial layer;

a plurality of first conductivity type second sensor portions formed below the plurality of the first sensor portions in the epitaxial layer;

a second conductivity type diffusion isolation region formed in the epitaxial layer between the first sensor portions;

a first conductivity type contact portion in the epitaxial layer connected to a surface of the semiconductor substrate, the first conductivity contact portion applying a predetermined voltage to the semiconductor substrate; and further wherein the contact portion is formed of the material that forms the second sensor portions which extends to contact the semiconductor substrate.

5. A solid-state imaging device as set forth in claim 1, furthermore comprising an electric field relaxation portion formed at least at a side of the diffusion isolation region.

6. The solid state imaging device as set forth in claim 1, wherein a distance from a surface of the epitaxial layer to the silicon substrate is less at the contact portion than at the sensor portions.

7. The solid state imaging device as set forth in claim 1, wherein the contact portion applies a voltage to the substrate.

8. A solid-state imaging device as set forth in claim 1, wherein gate electrodes of a plurality of transistors are formed perpendicularly above the second conductivity type diffusion isolation region.

9. A solid-state imaging device as set forth in claim 4, wherein gate electrodes of a plurality of transistors are formed perpendicularly above the second conductivity type diffusion isolation region.

* * * * *